US006974649B2

(12) United States Patent
Kim

(10) Patent No.: US 6,974,649 B2
(45) Date of Patent: Dec. 13, 2005

(54) STENCIL MASK FOR ELECTRON BEAM PROJECTION LITHOGRAPHY AND FABRICATION METHOD

(75) Inventor: Cheol Kyun Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 680 days.

(21) Appl. No.: 09/896,102

(22) Filed: Jul. 2, 2001

(65) Prior Publication Data

US 2002/0012852 A1 Jan. 31, 2002

(30) Foreign Application Priority Data

Jun. 30, 2000 (KR) .......................... 2000-36809

(51) Int. Cl.$^7$ .............................................. G03F 9/00
(52) U.S. Cl. ........................... 430/5; 430/296; 430/942
(58) Field of Search ............................ 430/5, 296, 942

(56) References Cited

U.S. PATENT DOCUMENTS 6,187,481 B1 * 2/2001 Rolfson ........................ 430/5

* cited by examiner

*Primary Examiner*—Christopher G. Young
(74) *Attorney, Agent, or Firm*—Pillsbury Winthrop LLP

(57) ABSTRACT

The present invention relates to a stencil mask for non-optical lithography and a method for fabricating such a mask. The disclosed stencil mask includes a frame for supporting the whole structure; a membrane disposed on the frame for equalizing stresses resulting from the electron beam; and a scattering layer pattern disposed on the membrane for scattering the electron beam. The scattering layer pattern includes regions of varying thickness and/or scattering performance that permit the exposure to be adjusted for areas having greater or lesser pattern density. These adjustments can reduce defects resulting from proximity effects, improve the uniformity of critical features, and improve the yield and reliability of the resulting devices.

8 Claims, 5 Drawing Sheets

STENCIL MASK FOR ELECTRON BEAM PROJECTION LITHOGRAPHY AND FABRICATION METHOD

BACKGROUND OF THE INVENTION

1. Field of the Invention

The present invention relates to a stencil mask for electron beam projection lithography and, in particular, to an improved stencil mask for electron beam projection lithography which can prevent the generation of pattern defects due to proximity effects and a method for fabricating such masks.

2. Description of the Background Art

Optical lithography is somewhat limited in its ability to produce a pattern of a size suitable for a highly integrated device. In order to overcome the limited resolution of optical lithography systems, it has been suggested that a non-optical lithography employing an electron beam, ion beam or X-ray as a light source should be employed. In particular there has been a lot of interest in electron beam projection lithography (EPL).

However, non-optical lithography cannot utilize a general exposure mask, such as an exposure mask where a CR pattern is formed on a quartz substrate. That is, the wavelengths of the electron beam, ion beam and X-ray exposure sources are only a few angstroms to a few hundred angstroms, and thus these light sources cannot penetrate the exposure mask.

Therefore, in non-optical lithography processes, especially in EPL, a stencil mask is used as a lithography mask. Here, the stencil mask is classified into an on/off type mask, a membrane mask which does not have an aperture region, or an on/off type mask using a scattering contrast.

The on/off type mask includes an aperture region which the electron beam permeates, and an interception region where penetration of the electron beam is intercepted. The interception region is formed by an absorber layer. Here, a thickness of the absorber layer must be greater than an electron penetration depth so as to absorb electrons in a consistent and dependable manner. Accordingly, a process for forming the absorber layer is complicated.

The membrane mask includes a scattering layer where electrons are scattered at a large angle, and a membrane which the electrons penetrate at a small angle. The membrane mask has been popularly employed in scattering with the angular limitation projection electron lithography (SCALPEL). In SCALPEL, the whole chip is exposed using one mask to improve productivity.

The on/off type mask using the scattering contrast includes an aperture region which electrons penetrate and a scattering layer where the electrons are scattered. The on/off mask using the scattering contrast has been employed for a projection reduction exposure with variable axis immersion lenses (PREVAIL).

The non-optical lithography using the aforementioned masks has a disadvantage in that whole regions of the chip are exposed one mask, thus generating a proximity effect between the adjacent regions that have different pattern densities. As a result, the desired patterns cannot be obtained uniformly in all regions of the chip.

For example, in a DRAM, the pattern density of the cell block, namely cell center region, is typically higher than the pattern density of the cell edge region. Accordingly, when a negative resist is utilized in a non-optical lithography process, the energy intensity of the cell edge region is lower than that of the cell center region, as illustrated in FIG. 1. Thus, critical dimensions in the actual pattern tend to be smaller in the cell edge region, thereby tending to cause a pattern collapse due to the altered aspect ratios in the cell edge region. Reference numeral 3 denotes a mask pattern, namely a scattering layer.

On the other hand, as depicted in FIG. 2, the different energy intensities of the regions can be corrected according to a method for adjusting a critical dimension of the scattering layer 3 in the mask, in particular the scattering layer 3 disposed in the cell edge region. However, if the material to be exposed is changed or a dose is varied, the reflection electron amount at the cell center region is different from that at the cell edge region. Thus, it is difficult to correct all variations of the critical dimension of the pattern in the cell edge region corresponding to the change of the material or the dose variation.

SUMMARY OF THE INVENTION

Accordingly, it is an object of the present invention to provide a stencil mask for easily correcting variations critical dimensions of a pattern resulting form proximity effects in regions having relatively low pattern density, and a method for fabricating such masks.

In order to achieve the above-described object of the present invention, there is provided a stencil mask including: a frame for supporting the whole structure; a membrane disposed on the frame for equalizing a stress due to an electron beam; and a scattering layer of pattern shape disposed on the membrane, for scattering the electron beam, wherein the scattering layer is thinner in those portions corresponding to regions having a relatively low pattern density and thicker in those portions corresponding to regions having a relatively high pattern density.

There is also provided a method for fabricating such a stencil mask, including the steps of: providing a structure on a frame including, a membrane having an aperture region, and stacking a material film to form a scattering layer; forming a resist pattern for blocking a portion corresponding to a region having a relatively high pattern density on the material film; etching the exposed material film to remove a predetermined thickness using the resist pattern as an etching mask; removing the resist pattern; and forming a scattering layer having a different thickness in each region, by patterning the material film, wherein the scattering layer is thinner in those portions corresponding to regions having a relatively low pattern density and is thicker in those portions corresponding to regions having a relatively high pattern density.

BRIEF DESCRIPTION OF THE DRAWINGS

The present invention will become better understood with reference to the accompanying drawings which are given only by way of illustration and thus should not be understood to limit the present invention, wherein.

DETAILED DESCRIPTION OF THE PREFERRED EMBODIMENTS

A stencil mask and a method for fabricating such masks in accordance with a preferred embodiment of the present invention will now be described in detail with reference to the accompanying drawings.

Figure 1:
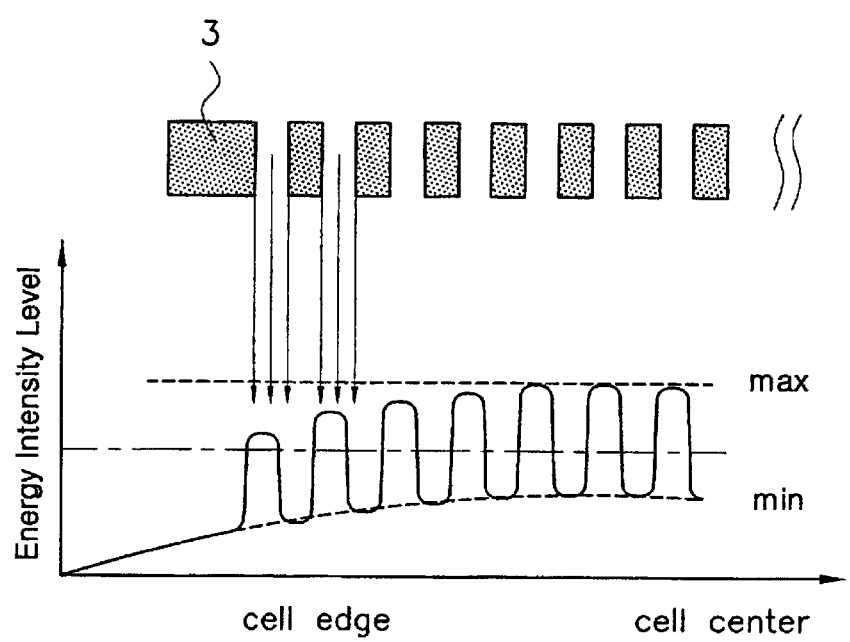
FIG. 1 shows a conventional mask pattern without proximity effect correction, and a resulting energy intensity distribution in a cell center region and a cell edge region.
Figure 2:
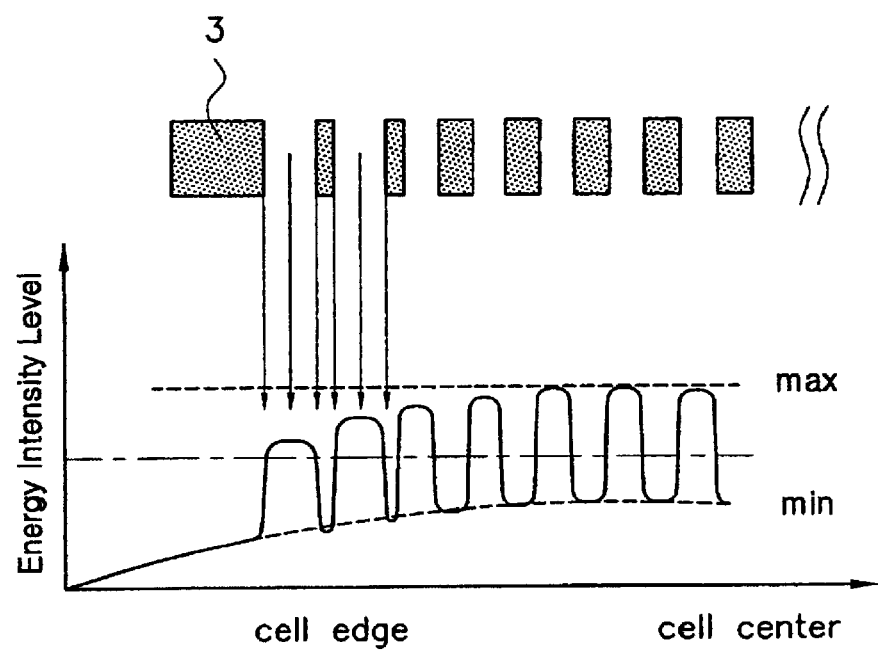
FIG. 2 shows a conventional mask pattern where the proximity effect has been corrected, and a resulting energy intensity distribution.
Figure 3:
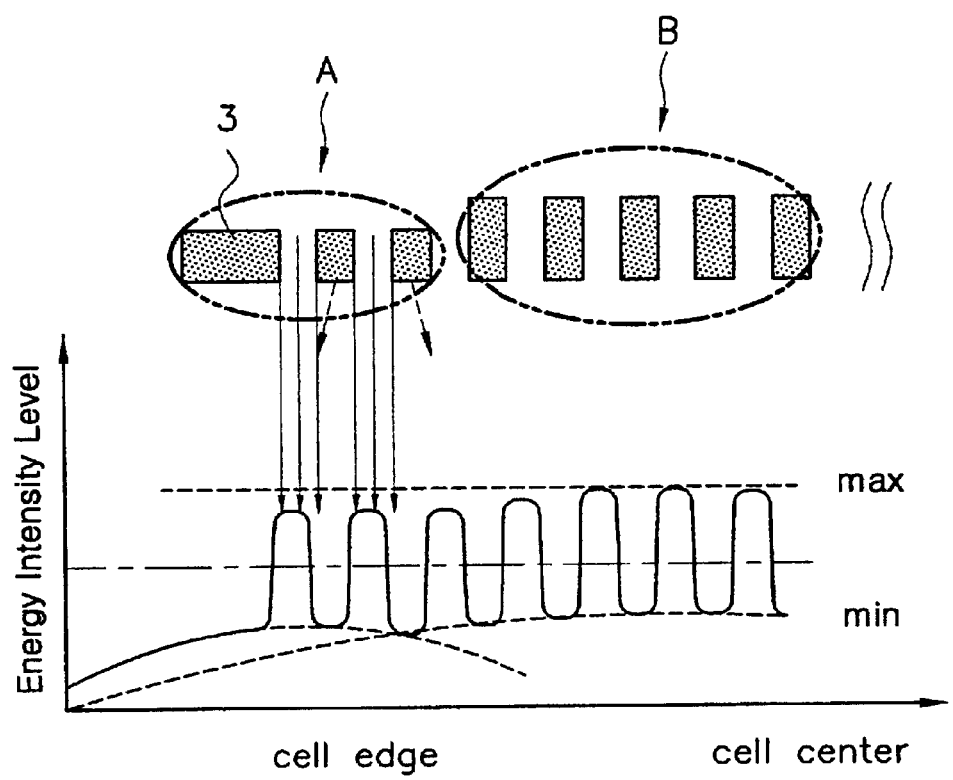
FIG. 3 shows a mask pattern where the proximity effect has been corrected in accordance with the present invention, and a resulting energy intensity distribution.

In the stencil mask in accordance with the present invention, as illustrated in FIG. 3, a scattering layer (A) disposed to corresponding to a cell edge region (hereinafter, first region) has a smaller thickness than a scattering layer (B) disposed to corresponding to a cell center region (hereinafter, second region). Thus, electrons permeating the first and second regions have a similar energy intensity.

As a result, the phenomenon in which critical dimensions in pattern decrease in the first region due to the proximity effect is prevented in a non-optical lithography process using the stencil mask in accordance with the present invention.

In more detail, in a non-optical lithography process using the mask having a scattering layer having different pattern densities and a uniform thickness, the first region has a lower energy intensity than the second region. This is because the first region is less influenced by refection electrons than the second region. Accordingly, the critical dimensions of the pattern are smaller in the first region as a result of the relatively low energy intensity when compared to the second region.

Figure 4:
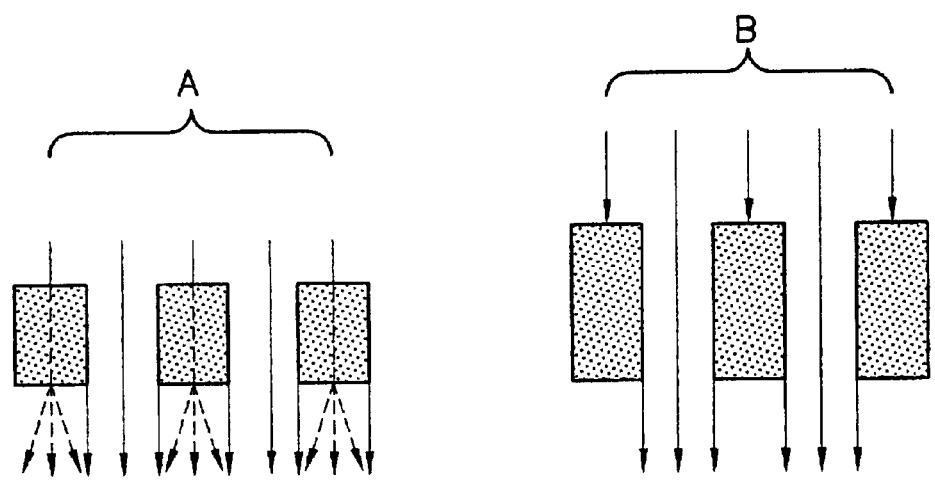
FIG. 4 is a cross-sectional diagram explaining an electron amount in a scattering layer having a different thickness.

Conversely, in non-optical lithography using the mask including a scattering layer having different pattern densities and different thicknesses, as depicted in FIG. 4, the electrons cannot penetrate the relatively thick scattering layer (B), but can penetrate the relatively thin scattering layer (A). Therefore, the number of electrons permeating the region having the relatively thin scattering layer, namely the first region, is greater than the number of electrons permeating the region having the relatively thick scattering layer, namely the second region. Accordingly, a non-optical lithography process using the stencil mask reduces the variation of the energy intensity between the first and second regions resulting from the proximity effect, and thus can easily be used to correct variations in the critical dimensions of the pattern in the first region. As a result, the reliability of the patterning process is improved by using the stencil mask in accordance with the present invention.

The method for fabricating the stencil mask in accordance with the present invention will now be described with reference to FIGS. 5A to 5D.

Figure 5A:
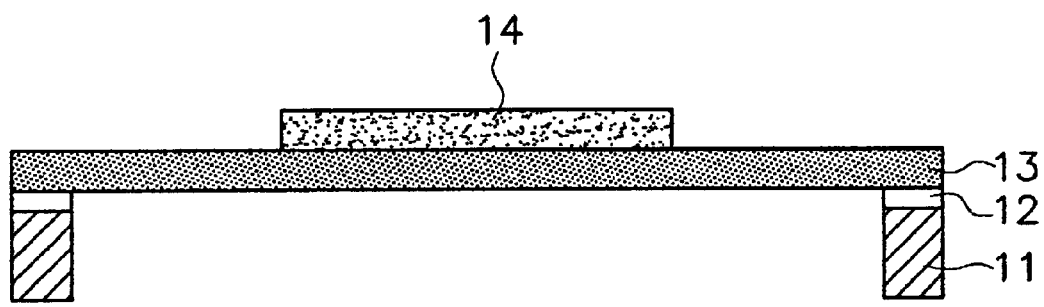
FIGS. 5A through 5D are cross-sectional diagrams illustrating sequential steps in a method for fabricating a stencil mask according to the present invention.

As illustrated in FIG. 5A, a stacked structure of a frame 11, a membrane 12 and a material film 13 for forming a scattering layer is provided according to a conventional process. The frame 11 serves to support the whole structure. The membrane 12 consists of an oxide film, and equalizes stress resulting from the electron beam. In addition, the membrane 12 includes an aperture region. A first resist pattern 14 is formed in a region having a relatively high pattern density, namely on the material film 13 corresponding to a cell center region.

Figure 5B:

Referring to FIG. 5B, the exposed material film is etched to remove a predetermined thickness using the first resist pattern 14 as an etching mask. Thereafter, the first resist pattern 14 is removed. As a result, the material film corresponding to a region having a relatively low pattern density, namely a cell edge region is thinner than the material film corresponding to the cell center region.

Figure 5C:
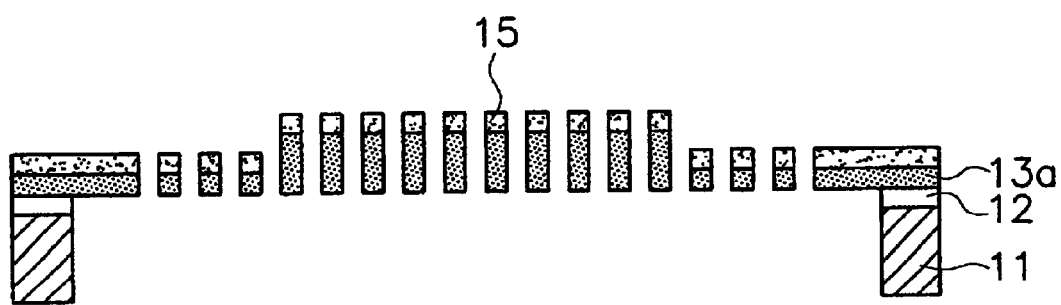

As shown in FIG. 5C, a second resist pattern 15 is formed on the material film 13 according to a conventional lithography process. The material film 13 is etched by using the second resist pattern 15 as an etching mask, thereby forming a scattering pattern 13a incorporating the different thickness in each region of film 13.

Figure 5D:
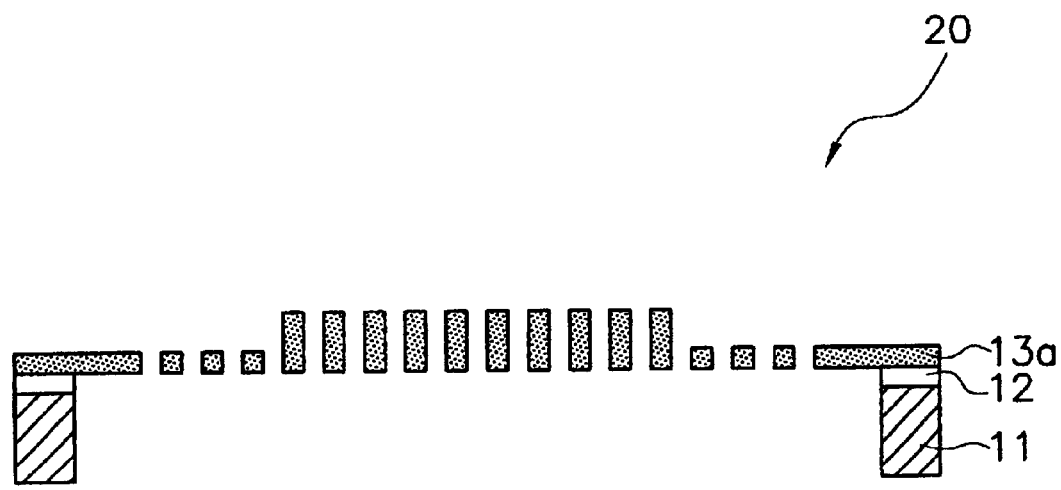

As depicted in FIG. 5D, the second resist pattern 15 is then removed, thereby completing the fabrication of the stencil mask 20 where the scattering layer corresponding to the cell edge region is thinner than the scattering layer corresponding to the cell center region.

In this embodiment, the scattering layer of the stencil mask has a different thickness in each region, but may consist of a different material in each region.

As discussed earlier, the decreased critical dimension of the pattern due to the proximity effect in regions having a relatively low pattern density can be easily corrected and restricted by forming a scattering layer having different thicknesses in each region. Accordingly, the desired patterns are consistently and uniformly formed across the whole chip by one exposure when employing a stencil mask according to the present invention.

Various other modifications to the basic process will be apparent to and can be readily made by those skilled in the art without departing from the scope and spirit of the present invention.

What is claimed is:

1. A stencil mask comprising:
   a frame;
   a membrane disposed on the frame; and
   a scattering layer pattern disposed on the membrane;
   wherein the scattering layer comprises both
      a thinner region, the thinner region characterized by a first pattern density and
      a thicker region, the thicker region characterized by a second pattern density,
      the first pattern density being lower than the second pattern density.

2. A stencil mask according to claim 1, wherein the thinner region has a thickness that is not more than 70% of the thickness of the thicker region.

3. A stencil mask comprising:
   a frame;
   a membrane disposed on the frame; and
   a scattering layer pattern disposed on the membrane;
   wherein the scattering layer comprises both
      a first region, the first region comprising a first material and being characterized by a first pattern density and
      a second region, the second region comprising a second material and being characterized by a second pattern density,
      wherein the first material exhibits a lower degree of scattering than the second material and the first pattern density is lower than the second pattern density.

4. A stencil mask according to claim 3, wherein the first material is characterized by a degree of scattering that is not more than 70% of a degree of scattering exhibited by the second material.

5. A method for fabricating a stencil mask, comprising the steps of:
   providing a stacked structure comprising a frame, a membrane having an aperture region, and a scattering layer;
   forming a resist pattern on the scattering layer, the resist pattern resulting in an exposed region on the scattering layer;
   etching the exposed region of the scattering layer to remove a predetermined thickness to form an etched scattering layer, the etched scattering layer having a thick region and a thin region;

removing the resist pattern; and forming a scattering layer pattern on the etched scattering layer; and removing regions of the etched scattering layer to form a scattering layer pattern.

6. A method for fabricating a stencil mask, comprising the steps of:

providing a stacked structure comprising a frame, a membrane having an aperture region, and a scattering layer, the scattering layer comprising at least two different materials;

forming a resist pattern on the scattering layer, the resist pattern resulting in an exposed region on the scattering layer;

etching the exposed region of the scattering layer to remove a predetermined thickness to form an etched scattering layer;

removing the resist pattern; and forming a scattering layer pattern on the etched scattering layer; and removing regions of the etched scattering layer to form a scattering layer pattern.

7. A method for fabricating a stencil mask according to claim 6 wherein the scattering layer comprises a first material and a second material, the first material and the second material arranged in an adjacent relationship on the membrane.

8. A method for fabricating a stencil mask according to claim 6 wherein the scattering layer comprises a first material and a second material, the first material and the second material being arranged in a vertically stacked relationship on the membrane.

* * * * *